(12) United States Patent
Song

(10) Patent No.: US 8,519,492 B2
(45) Date of Patent: Aug. 27, 2013

(54) SILICON CONDENSER MICROPHONE HAVING AN ADDITIONAL BACK CHAMBER AND A FABRICATION METHOD THEREFOR

(75) Inventor: Chung-Dam Song, Seoul (KR)

(73) Assignee: BSE Co., Ltd., Incheon (KR)

(*) Notice: Subject to any disclaimer, the term of this patent is extended or adjusted under 35 U.S.C. 154(b) by 0 days.

(21) Appl. No.: 13/143,585

(22) PCT Filed: Feb. 11, 2010

(86) PCT No.: PCT/KR2010/000873
§ 371 (c)(1),
(2), (4) Date: Jul. 7, 2011

(87) PCT Pub. No.: WO2011/049276
PCT Pub. Date: Apr. 28, 2011

(65) Prior Publication Data
US 2011/0266641 A1 Nov. 3, 2011

(30) Foreign Application Priority Data
Oct. 19, 2009 (KR) ........................ 10-2009-0099222

(51) Int. Cl.
*H01L 29/84* (2006.01)
(52) U.S. Cl.
USPC ................................... 257/416; 257/E29.324
(58) Field of Classification Search
USPC ............. 438/26, 51, 106; 257/416, E29.324; 381/175
See application file for complete search history.

(56) References Cited

U.S. PATENT DOCUMENTS
7,706,554 B2 * 4/2010 Ogura et al. .................. 381/175

FOREIGN PATENT DOCUMENTS
| KR | 10-0675022 B1 | 1/2007 |
| KR | 10-0675023 B1 | 1/2007 |
| KR | 10-0722689 B1 | 5/2007 |
| KR | 10-0904285 B1 | 6/2009 |
| WO | WO 2007129787 A1 * | 11/2007 |

OTHER PUBLICATIONS
International Search Report: mailed Nov. 18, 2010; Appln. PCT/KR2010/000873.

* cited by examiner

*Primary Examiner* — Brook Kebede
(74) *Attorney, Agent, or Firm* — Ladas & Parry LLP

(57) ABSTRACT

A fabrication method of a silicon condenser microphone having an additional back chamber. The method includes applying an adhesive on a substrate and mounting a chamber container thereon by using a mounter; curing the adhesive holding the chamber container; applying an adhesive on the chamber container and mounting a micro electro mechanical system (MEMS) chip thereon by using a mounter; curing the adhesive holding the MEMS chip; and attaching the substrate on which devices are mounted to a case, wherein a back chamber formed by the chamber container is added to a back chamber of the MEMS chip. Therefore, a silicon condenser microphone fabricated by using the method may have improved sensitivity by increasing the small back chamber space of the a micro electro mechanical system (MEMS) chip itself and reduced noise including total harmonic distortion (THD).

18 Claims, 10 Drawing Sheets

SILICON CONDENSER MICROPHONE HAVING AN ADDITIONAL BACK CHAMBER AND A FABRICATION METHOD THEREFOR

TECHNICAL FIELD

The present invention relates to a silicon condenser microphone and a method of fabricating the same, and more particularly, to a silicon condenser microphone having an additional back chamber and a method of fabricating the same.

BACKGROUND ART

Generally, a condenser microphone widely used in mobile communication terminals or mobile audio devices includes a voltage bias component, a pair of diaphragm/back plate for forming a capacitance C that changes in correspondence with sound pressures, and a field effect transistor (JFET) for buffering output signals. Such is a traditional type condenser microphone is completely formed as a single assembly by inserting a diaphragm, a spacer ring, an insulation ring, a back plate, and an electric current application ring into a single case in the stated order, inserting a PCB, on which circuit devices are mounted, into the case, and bending an end of the case toward the PCB.

Recently, a semiconductor fabrication technique using micromachining methods has been used for improving the integration of fine devices. By using this technique, a so-called micro electro mechanical system (MEMS), μm-sized ultra-small sensors, actuators, and electro-mechanical structures may be fabricated by using micromachining methods, and more particularly, integrated circuit methods, in a semiconductor fabrication process. In a MEMS chip microphone fabricated by using such micromachining methods, traditional microphone components, such as a diaphragm, a spacer ring, an insulation ring, a back plate, and an electric current application ring may be miniaturized, multi-functionalized, and densely integrated via ultra-high precision fabrication methods for improved stability and reliability.

FIG. 9 shows a structure of a general MEMS chip 10 used in a silicon condenser microphone. Referring to FIG. 9, the MEMS chip 10 has a structure in which a back plate 13 is formed on a silicon wafer 14 by using a MEMS technique and a diaphragm 11 is formed on the back plate 13 by interposing a spacer 12 therebetween. A sound hole 13a is formed in the back plate 13, and a rear space of the back plate forms a back chamber. The MEMS chip 10 is fabricated by using a general micromachining method and a semiconductor chip fabrication method.

FIG. 10 is a lateral sectional view of a conventional silicon condenser microphone 1 embodied by using a MEMS chip 10. Referring to FIG. 10, the conventional silicon condenser microphone 1 is assembled by mounting the MEMS chip 10 and an ASIC chip 20 on a PCB 40 and inserting the PCB 40 into a case 30 in which a sound hole 30a is formed.

As shown in FIG. 10, a back chamber 15 of the conventional silicon condenser microphone 1 is formed by the MEMS chip 10. However, the MEMS chip 10 is a very small-sized semiconductor chip, and thus, the back chamber 15 formed by the MEMS chip 10 is very narrow. As a result, air resistance occurs due to a significant back stream and a vibrating force of a diaphragm deteriorates, and thus, the sound quality is (sensitivity) of the conventional silicon condenser microphone 1 deteriorates.

DISCLOSURE OF THE INVENTION

Technical Problem

The present invention provides a silicon condenser microphone having an additional back chamber and a method of fabricating the same.

Technical Solution

According to an aspect of the present invention, there is provided a method of fabricating a silicon condenser microphone having an additional back chamber, the method including applying an adhesive on a substrate and mounting a chamber container thereon by using a mounter; curing the adhesive holding the chamber container; applying an adhesive on the chamber container and mounting a micro electro mechanical system (MEMS) chip thereon by using a mounter; curing the adhesive holding the MEMS chip; and attaching the substrate on which devices are mounted to a case, wherein a back chamber formed by the chamber container is added to a back chamber of the MEMS chip.

The substrate is a printed circuit board (PCB), a glass substrate, a ceramic substrate, a plastic-based substrate, or a resin substrate. The adhesive is any one of a non-conductive adhesive and a conductive adhesive. The adhesive is any one of a silicon-based adhesive, an epoxy-based adhesive, and a metal solder.

The chamber container has a cuboidal shape or a cylindrical shape with one opne surface, and wherein a penetration hole is formed in a surface opposite to the open surface. A wing may be formed at the open surface of the chamber container.

According to another aspect of the present invention, there is provided a silicon condenser microphone having an additional back chamber, the silicon condenser microphone including a substrate; a chamber container, which has a cuboidal shape or a cylindrical shape with one open surface, forms an additional back chamber space as the open surface is adhered to the substrate via an adhesive, and has a penetration hole formed in a surface opposite to the open surface; a MEMS chip, which is attached to the surface of the chamber container opposite to the open surface and converts externally introduced sound pressures to electric signals; an application specific integrated circuit (ASIC) chip, which is mounted on the substrate, supplies power to the MEMS chip, amplifies electric signals from the MEMS chip, and outputs the amplified signals via a connection terminal of the substrate; and a case, which has a cylindrical shape with one open surface, forms a space for accommodating the chamber container, the MEMS chip, and the ASIC chip as the open surface is attached to the substrate, and shields external noise.

Sound holes are formed in one of or both of the substrate and the case. The chamber container has a cuboidal shape or a cylindrical shape, and wherein a wing is formed outwardly on the open surface.

Advantageous Effects

A silicon condenser microphone fabricated according to the present invention can have improved sensitivity by increasing the small back chamber space of the MEMS chip itself and reduced noise including THD (Total Harmonic Distortion).

BEST MODE FOR CARRYING OUT THE INVENTION

The present invention will now be described more fully with reference to the accompanying drawings, in which exemplary embodiments of the invention are shown. The invention may, however, be embodied in many different forms and should not be construed as being limited to the embodiments set forth herein.

Figure 1:
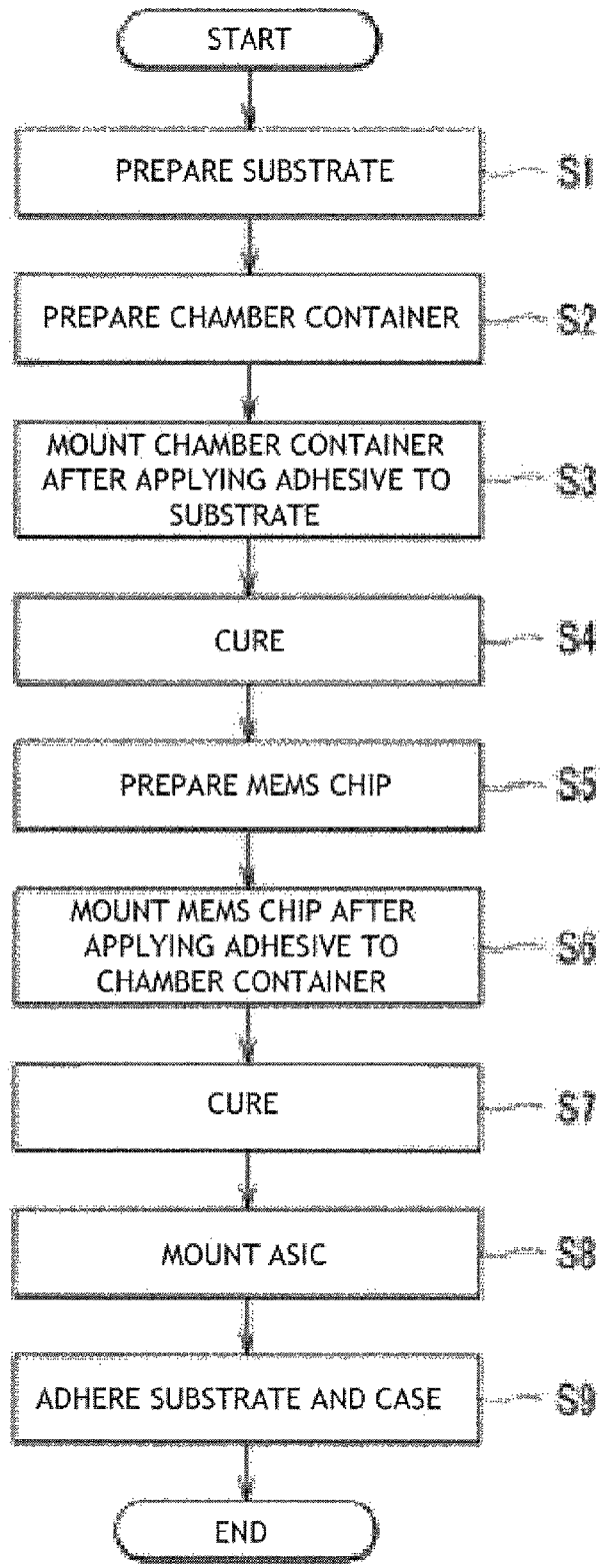
FIG. 1 is a flowchart showing a method of fabricating a silicon condenser microphone according to an embodiment of the present invention.

FIG. 1 is a flowchart showing a method of fabricating a silicon condenser microphone according to an embodiment of the present invention.

As shown in FIG. 1, the method of forming a silicon condenser microphone having an additional back chamber includes preparing a substrate (operation S1), preparing a chamber container (operation S2), applying an adhesive on the substrate and mounting the chamber container thereon by using a mounter (operation S3), curing the adhesive holding the chamber container at a predetermined temperature (operation S4), preparing a micro electro mechanical system (MEMS) chip (operation S5), applying an adhesive on the chamber container and mounting the MEMS chip thereon by using a mounter (operation S6), curing the adhesive holding the MEMS chip at a predetermined temperature (operation S7), mounting an application specific integrated circuit (ASIC) (operation S8), and attaching the substrate on which devices are mounted to a case (operation S9).

Figure 2:
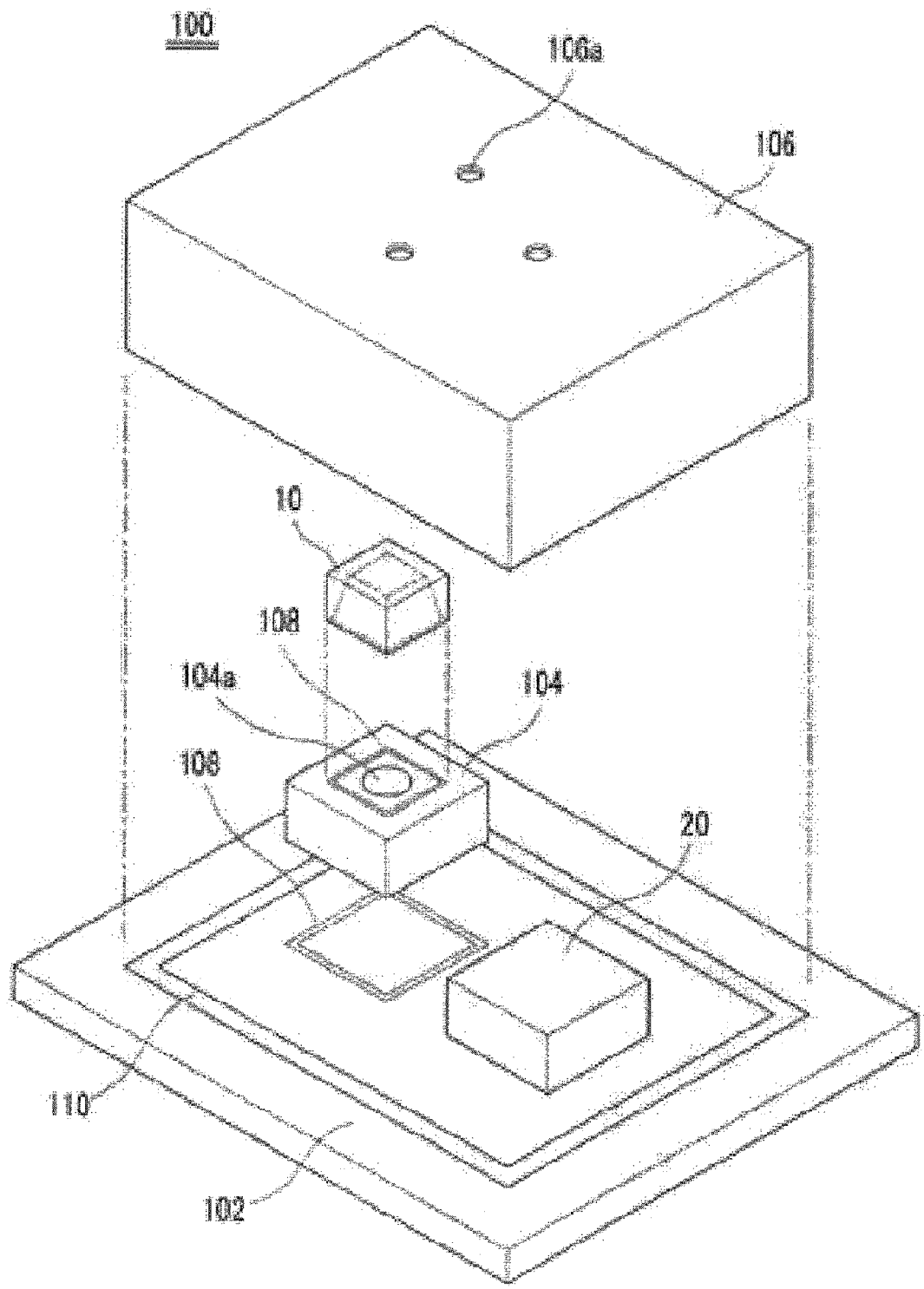
FIG. 2 is an exploded perspective view of a silicon condenser microphone having an additional back chamber that is fabricated according to an embodiment of the present invention.
Figure 3:
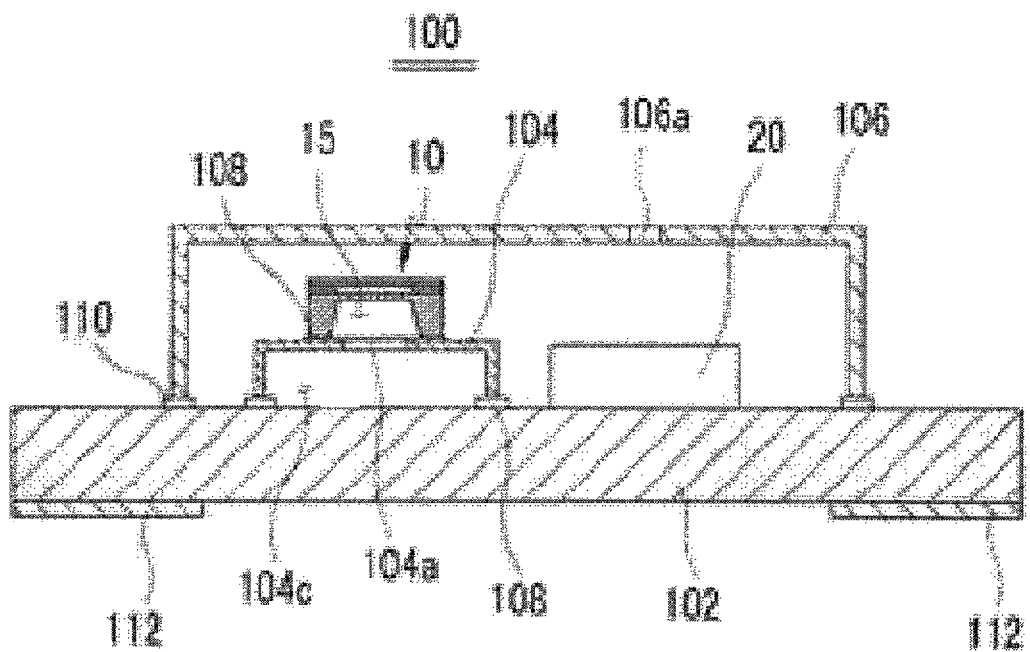
FIG. 3 is a combined perspective view of the same.

FIG. 2 is an exploded perspective view of a silicon condenser microphone having an additional back chamber that is fabricated according to an embodiment of the present invention. FIG. 3 is a combined perspective view of the same.

As shown in FIGS. 2 and 3, a silicon condenser microphone 100 having an additional back chamber that is fabricated according to the present invention has a structure in which a chamber container 104 for forming an additional back chamber 104c is adhered onto a PCB 102, on which a connection terminal 112 and a conductive pattern are formed, by using an adhesive 108, a MEMS chip 10 is adhered onto the chamber container 104 by using an adhesive 10, and a case 106 is adhered onto the PCB 102 by using an adhesive 110. Here, an ASIC chip 20 for driving electric signals of the MEMS chip 10 is also mounted on the PCB 102.

The chamber container 104 is provided to improve the sensitivity of the silicon condenser microphone 100 by increasing the small back chamber 15 space of the MEMS chip itself and reduce noise including total harmonic distortion (THD) and has a cuboidal or cylindrical shape with one open surface. A penetration hole 104a for connecting the back chamber 15 to the additional back chamber 104c is formed in a surface opposite to the open surface. Furthermore, although not shown, an electric wiring is formed in the chamber container 104 for transmitting electric signals from the MEMS chip 10 to the ASIC chip 20. Therefore, the increased back chamber space, which is formed by adding the additional back chamber 104c to the back chamber 15 of the MEMS chip 10, may improve the low sensitivity due to a deteriorated vibrating force of a diaphragm caused by air resistance that is formed by a significant back stream due to insufficient back chamber space of the MEMS chip 10.

The MEMS chip 10 is adhered onto the chamber container 104 by using the adhesive 108, the ASIC chip 20 is mounted on the PCB 102, and the case 106 is adhered to the PCB 102 by using the adhesive 110. Accordingly, the assembly of the silicon condenser microphone is completed.

The case 106 has a cylindrical shape, which has an inner space for accommodating components and one open surface. A sound hole 106a for introducing external sounds is formed in a surface opposite to the open surface, and the case 106 is attached to the PCB 102 by aligning the case 106 formed of a metal material to a conductive pattern formed on the PCB 102 and welding the case 106 to the PCB 102 or adhering the case 106 to the PCB 102 by using the adhesive 110, such as an epoxy.

Figure 4:
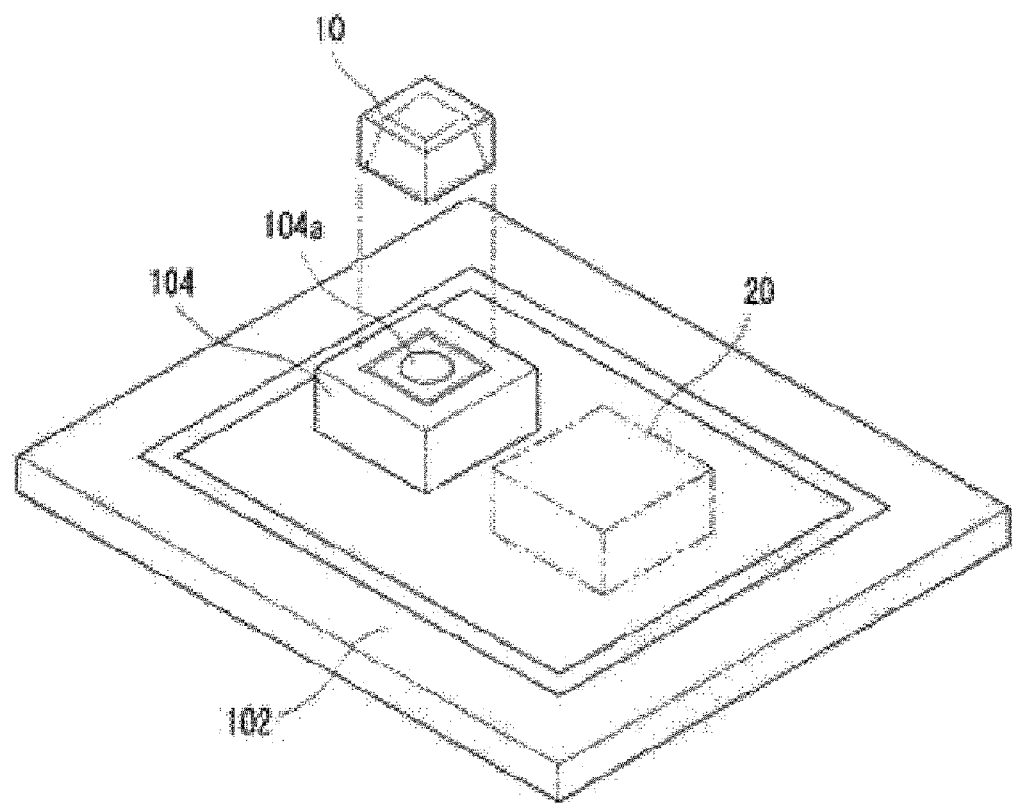
FIG. 4 is a diagram showing an additional back chamber structure having a cuboidal shape according to an embodiment of the present invention.
Figure 5:
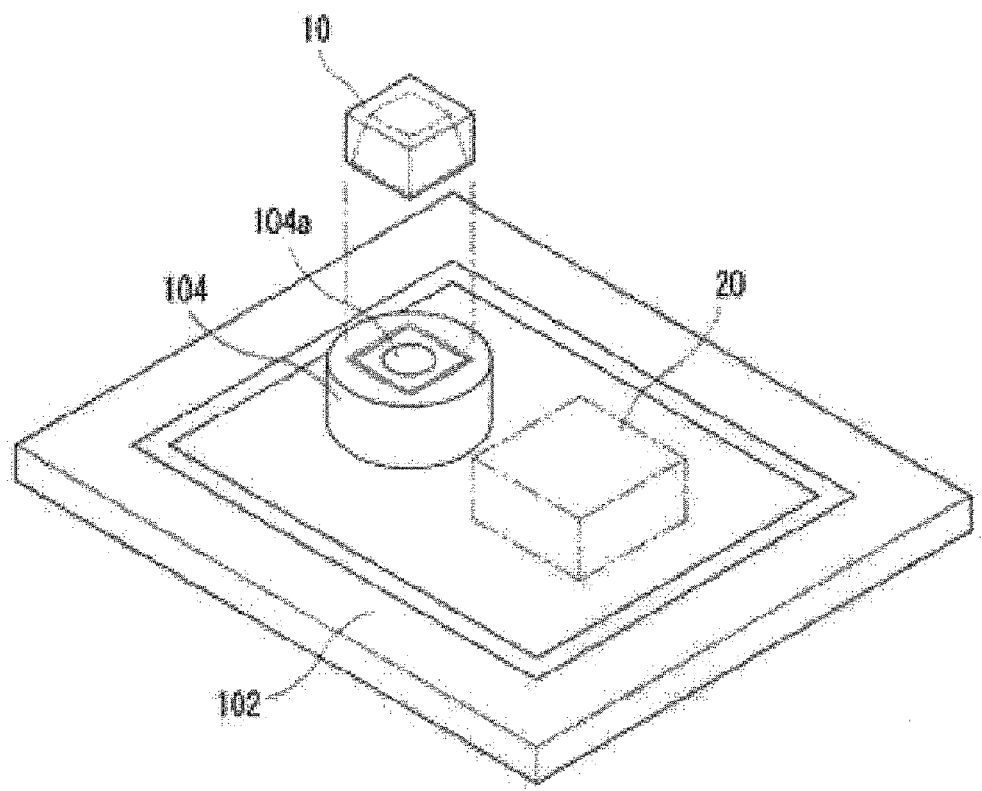
FIG. 5 is a diagram showing an additional back chamber structure having a cylindrical shape according to an embodiment of the present invention.

FIG. 4 is a diagram showing an additional back chamber structure having a cuboidal shape according to an embodiment of the present invention. FIG. 5 is a diagram showing an additional back chamber structure having a cylindrical shape according to an embodiment of the present invention.

As shown in FIGS. 4 and 5, the chamber container 104 for forming the additional back chamber 104c according to the present invention may have a cuboidal shape or a cylindrical shape, and the penetration hole 104a for forming a path to the back chamber 15 that is formed by attaching the MEMS chip 10 is formed in the top of the cuboid or the cylinder.

A silicon condenser microphone of any of various shapes may be fabricated by attaching the case 106 of any of various shapes onto the PCB 102, on which the MEMS chip 10 having the additional back chamber 104c formed by the chamber container 104 and the ASIC chip 20 are mounted.

Figure 6:
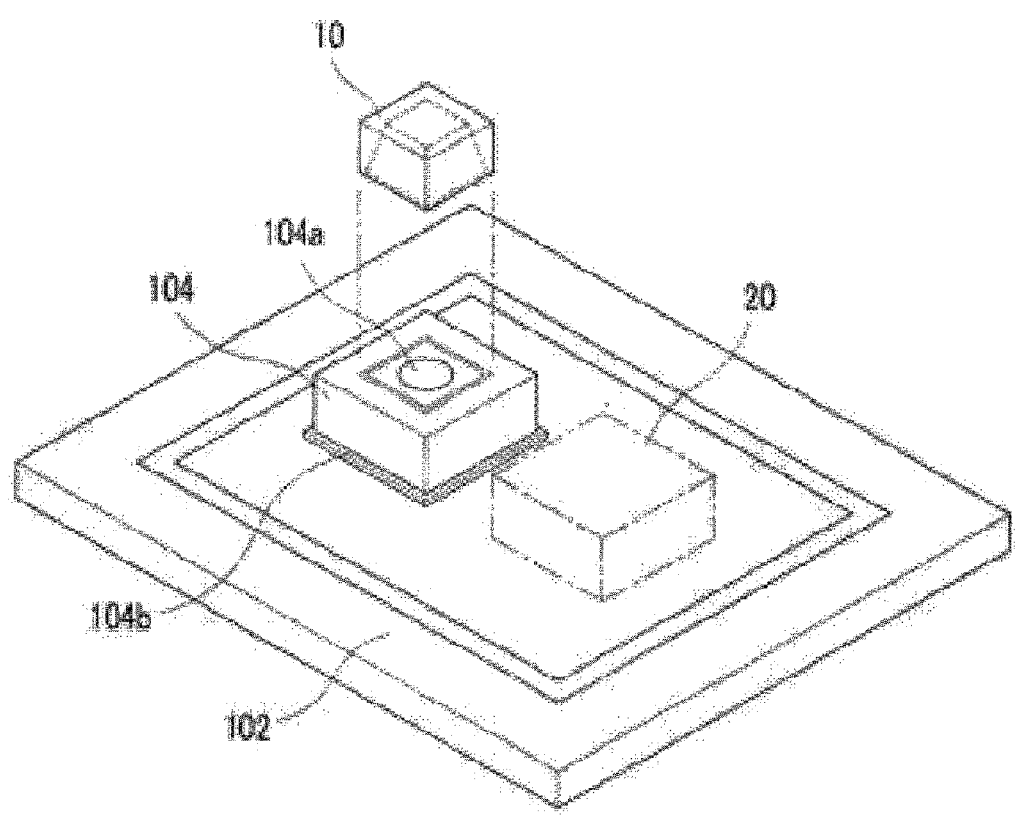
FIG. 6 is a diagram showing an additional back chamber structure having a cuboidal shape and a wing.
Figure 7:
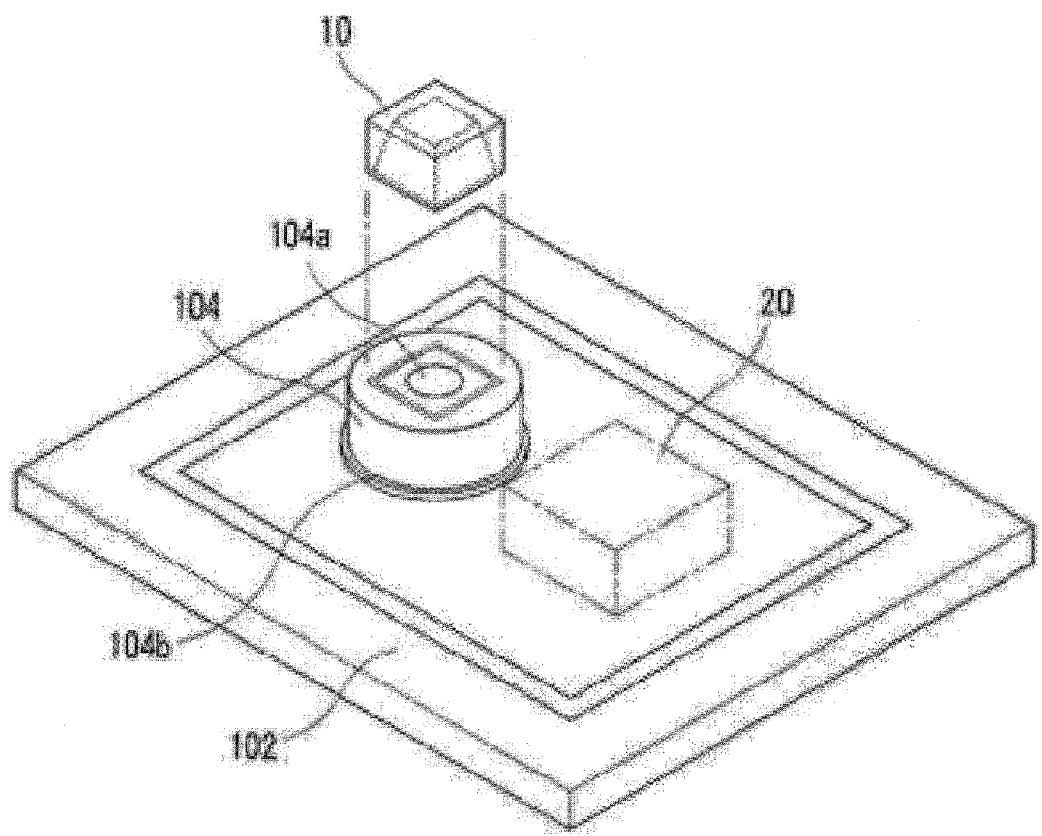
FIG. 7 is a diagram showing an additional back chamber structure having a cylindrical shape and a wing.
Figure 8:
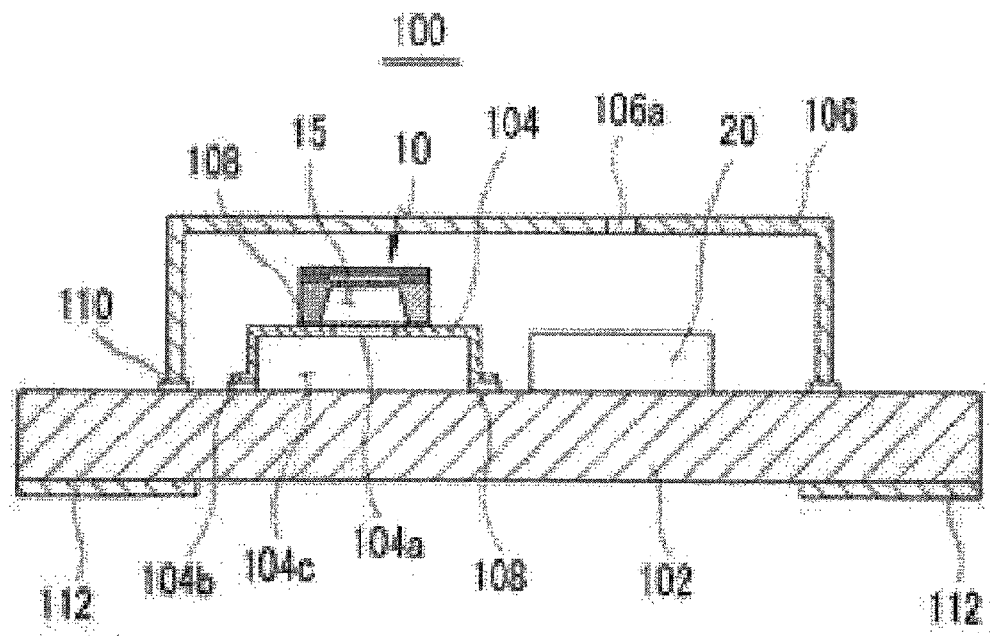
FIG. 8 is a combined perspective view of a silicon condenser microphone having a back chamber structure with a wing.
Figure 9:
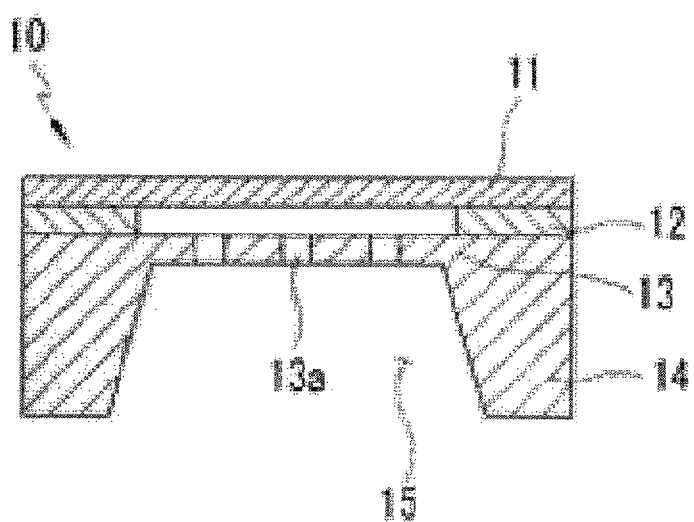
FIG. 9 shows a structure of a general micro electro mechanical system (MEMS) chip used in a silicon condenser microphone.
Figure 10:
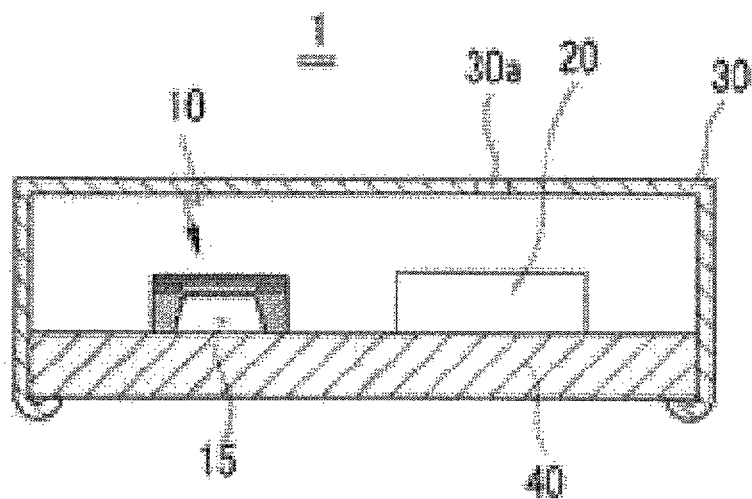
FIG. 10 is a lateral sectional view of a conventional silicon condenser microphone embodied by using a MEMS chip.

FIG. 6 is a diagram showing an additional back chamber structure having a cuboidal shape and a wing. FIG. 7 is a diagram showing an additional back chamber structure having a cylindrical shape and a wing. FIG. 8 is a combined perspective view of a silicon condenser microphone having aback chamber structure with a wing.

Referring to FIGS. 6 through 8, the chamber container 104 for forming the additional back chamber 104c may have a cuboidal shape or a cylindrical shape with a wing as shown in FIGS. 6 and 7, the penetration hole 104a for forming a path to the back chamber 15 that is formed by attaching the MEMS chip 10 is formed in the top of the cuboid or the cylinder with the wing.

A silicon condenser microphone of any of various shapes may be fabricated by attaching the case 106 of any of various shapes onto the PCB 102, on which the MEMS chip 10 having the additional back chamber 104c formed by the chamber container 104 with the wing and the ASIC chip 20 are mounted.

While the present invention has been particularly shown and described with reference to exemplary embodiments thereof, it will be understood by those of ordinary skill in the art that various changes in form and details may be made therein without departing from the spirit and scope of the present invention as defined by the following claims.

Industrial Applicability

A silicon condenser microphone fabricated according to the present invention can have improved sensitivity by increasing the small back chamber space of the MEMS chip itself and reduced noise including THD (Total Harmonic Distortion). Thus, the silicon condenser microphone may be highly industrially applicable.

The invention claimed is:

1. A method of fabricating a silicon condenser microphone having an additional back chamber, the method comprising:
    applying a first adhesive on a substrate and mounting a chamber container thereon by using a mounter;
    curing the first adhesive holding the chamber container;
    applying a second adhesive on the chamber container and mounting a micro electro mechanical system (MEMS) chip thereon by using a mounter;
    curing the second adhesive holding the MEMS chip; and
    attaching the substrate on which devices are mounted to a case,
    wherein a back chamber formed by the chamber container is added to a back chamber of the MEMS chip.

2. The method of claim 1, wherein the substrate is a printed circuit board (PCB), a glass substrate, a ceramic substrate, a plastic-based substrate, or a resin substrate.

3. The method of claim 1, wherein the first and second adhesives are any one of a non-conductive adhesive and a conductive adhesive.

4. The method of claim 1, wherein the first and second adhesives are any one of a silicon-based adhesive, an epoxy-based adhesive, and a metal solder.

5. The method of claim 1, wherein the chamber container has a cuboidal shape or a cylindrical shape with one open surface, and
    wherein a penetration hole is formed in a surface opposite to the open surface.

6. The method of claim 5, wherein a wing is formed at the open surface of the chamber container, wherein the wing extends outward away from the chamber container along a surface of the substrate to which the chamber container is mounted.

7. The method of claim 1, further comprising: forming a sound hole in the case.

8. A silicon condenser microphone having an additional back chamber, the silicon condenser microphone comprising:
    a substrate;
    a chamber container, which has a cuboidal shape or a cylindrical shape with one open surface, forms an additional back chamber space as the open surface is adhered to the substrate via cured adhesive, and has a penetration hole formed in a surface opposite to the open surface;
    a MEMS chip, which is attached to the surface of the chamber container opposite to the open surface and converts externally introduced sound pressures to electric signals;
    an application specific integrated circuit (ASIC) chip, which is mounted on the substrate, supplies power to the MEMS chip, amplifies electric signals from the MEMS chip, and outputs the amplified signals via a connection terminal of the substrate; and
    a case, which has a cylindrical shape with one open surface, forms a space for accommodating the chamber container, the MEMS chip, and the ASIC chip as the open surface is attached to the substrate, and shields external noise.

9. The silicon condenser microphone of claim 8, wherein sound holes are formed in one of or both of the substrate and the case.

10. The silicon condenser microphone of claim 8, wherein the chamber container has a cuboidal shape or a cylindrical shape, and
    wherein a wing is formed outwardly on the open surface so as to extend away from the chamber container and along a surface of the substrate to which the chamber container is mounted.

11. The silicon condenser microphone of claim 8, wherein a sound hole is formed in the case.

12. A method of fabricating a silicon condenser microphone having an additional back chamber, the method comprising:
    applying a first adhesive on a substrate and mounting a chamber container thereon by using a mounter;
    curing the first adhesive holding the chamber container at a predetermined temperature;
    after curing the first adhesive, applying a second adhesive on the chamber container and mounting a micro electro mechanical system (MEMS) chip thereon by using a mounter;
    curing the second adhesive holding the MEMS chip at a predetermined temperature; and
    attaching the substrate on which devices are mounted to a case,
    wherein a back chamber formed by the chamber container is added to a back chamber of the MEMS chip.

13. The method of claim 12, wherein the substrate is a printed circuit board (PCB), a glass substrate, a ceramic substrate, a plastic-based substrate, or a resin substrate.

14. The method of claim 12, wherein the adhesive is any one of a non-conductive adhesive and a conductive adhesive.

15. The method of claim 12, wherein the adhesive is any one of a silicon-based adhesive, an epoxy-based adhesive, and a metal solder.

16. The method of claim 12, wherein the chamber container has a cuboidal shape or a cylindrical shape with one open surface, and
    wherein a penetration hole is formed in a surface opposite to the open surface.

17. The method of claim 16, wherein a wing is formed at the open surface of the chamber container, wherein the wind extends outward away from the chamber container along a surface of the substrate to which the chamber container is mounted.

18. The method of claim 12, further comprising: forming a sound hole in the case.

* * * * *